(12) United States Patent
Von Elm (10) Patent No.: US 11,563,305 B2
(45) Date of Patent: Jan. 24, 2023

(54) RESONANTLY ENHANCED FREQUENCY CONVERSION WITH ADAPTIVE THERMAL-LENSING COMPENSATION

(71) Applicant: Coherent LaserSystems GmbH & Co. KG, Göttingen (DE)

(72) Inventor: Rüdiger Von Elm, Wielen (DE)

(73) Assignee: Coherent LaserSystems GmbH & Co. KG, Göttingen (DE)

( * ) Notice: Subject to any disclaimer, the term of this patent is extended or adjusted under 35 U.S.C. 154(b) by 133 days.

(21) Appl. No.: 17/231,932

(22) Filed: Apr. 15, 2021

(65) Prior Publication Data

US 2022/0337031 A1  Oct. 20, 2022

(51) Int. Cl.
| | |
|---|---|
| *G02F 1/35* | (2006.01) |
| *G02F 1/355* | (2006.01) |
| *H01S 5/06* | (2006.01) |
| *H01S 5/10* | (2021.01) |
| *G02B 7/18* | (2021.01) |
| *G02B 17/08* | (2006.01) |
| *G02B 26/06* | (2006.01) |

(52) U.S. Cl.
CPC .......... *H01S 5/0615* (2013.01); *G02B 7/1815* (2013.01); *G02B 17/0836* (2013.01); *G02F 1/3542* (2021.01); *H01S 5/0604* (2013.01); *H01S 5/101* (2013.01); *G02B 17/0856* (2013.01); *G02B 26/06* (2013.01); *G02F 1/3551* (2013.01)

(58) Field of Classification Search
CPC ............ G02B 17/0836; G02B 17/0856; G02B 7/1815; G01F 1/35–3558; G02F 1/3542
See application file for complete search history.

(56) References Cited

U.S. PATENT DOCUMENTS

| | | | |
|---|---|---|---|
| 5,095,491 A | 3/1992 | Kozlovsky et al. | |
| 5,289,491 A | 2/1994 | Dixon | |
| 5,561,547 A | 10/1996 | Keirstead et al. | |
| 5,930,283 A | 7/1999 | Imai et al. | |

(Continued)

OTHER PUBLICATIONS

Inon Moshe and Steven Jackel, "Correction of birefringence and thermal lensing in nonreciprocal resonators by use of a dynamic imaging mirror," Appl. Opt. 39, 4313-4319 (2000). (Year: 2000).*

(Continued)

*Primary Examiner* — Rhonda S Peace
(74) *Attorney, Agent, or Firm* — Morrison & Foerster LLP (57) ABSTRACT

A system for resonantly enhanced frequency conversion includes a nonlinear crystal for frequency converting a pump laser beam, and mirrors forming a ring resonator for the pump laser beam such that a closed propagation path of the pump laser beam, inside the ring resonator, passes through the nonlinear crystal. The mirrors include an adaptive mirror, a curved-mirror pair positioned in a first segment of the propagation path spanning between the adaptive mirror and the nonlinear crystal, and an input coupler for coupling the pump laser beam into the ring resonator. The curved-mirror pair forms an imaging system having conjugate planes at the adaptive mirror and the nonlinear crystal. The input coupler is positioned in a second segment of the propagation path that spans between the adaptive mirror and the nonlinear crystal and does not include deflection by the curved-mirror pair.

20 Claims, 5 Drawing Sheets

(56) References Cited

U.S. PATENT DOCUMENTS

| | | |
|---|---|---|
| 2003/0099262 A1 | 5/2003 | Masuda |
| 2005/0163187 A1 | 7/2005 | Spinelli et al. |
| 2011/0032598 A1 | 2/2011 | Guthrie et al. |
| 2015/0268532 A1 | 9/2015 | Donner et al. |
| 2018/0166847 A1 | 6/2018 | Cao et al. |

OTHER PUBLICATIONS

Kevin Schmidt, Tom Dietrich, Benjamin Dannecker, Thomas Graf, Marwan Abdou Ahmed, Oliver Sawodny, "On compensating thermal lensing in high-power lasers using intra-cavity deformable mirrors," IFAC-PapersOnLine, vol. 52, Issue 15, 2019. (Year: 2019).*

Arain et al., (2007). "Adaptive beam shaping by controlled thermal lensing in optical elements," Applied Optics, 46(12):2153-2165.

Brooks et al., (2016). "Overview of Advanced LIGO adaptive optics," Applied Optics, 55(29):8256-8265.

Perreca et al., (2020). "An analysis and visualization of the output mode-matching Yequirements for squeezing in Advanced LIGO and future gravitational wave detectors," Phys. Rev. D, 101:1-14.

Schmid et al., (2018). "Thermally deformable mirror to compensate for phase aberrations in high-power laser systems," Journal of the Optical Society of America B, 35(11):2661-2666.

Couillaud et al., (1984). "High Power CW Sum-frequency Generation Near 243 nm Using Two Intersecting Enhancement Cavities," Optics Communications, 50(2):127-129.

International Search Report and Written Opinion received for International Patent Application No. PCT/EP2022/059525 dated Aug. 16, 2022, 17 pages.

Steinlechner et al., (2012). "Photothermal self-phase-modulation technique for absorption measurements on high-reflective coatings," Applied Optics, 51(8):1156-1161.

* cited by examiner

RESONANTLY ENHANCED FREQUENCY CONVERSION WITH ADAPTIVE THERMAL-LENSING COMPENSATION

TECHNICAL FIELD OF THE INVENTION

The present invention relates in general to frequency conversion of a laser beam in an enhancement cavity, in particular to intra-cavity compensation for thermal lensing within optical elements in the enhancement cavity.

DISCUSSION OF BACKGROUND ART

Lasers are used in an ever-expanding array of applications, including machining, communications, remote sensing, medical procedures, and scientific research. Laser applications often require laser light at a wavelength that cannot, at least efficiently, be directly generated by a laser. In such situations, frequency conversion in an optically nonlinear medium may be used to generate laser radiation at the desired wavelength from laser radiation of another fundamental wavelength that can be directly generated. For example, ultraviolet laser radiation may be generated in a nonlinear crystal by frequency doubling visible laser radiation.

The efficiency of frequency doubling of fundamental laser radiation is proportional to the square of the intensity of the fundamental laser radiation. Depending on the scenario, thermal effects, depletion of the fundamental laser radiation, and other factors may cause deviations from this relationship. However, in most cases, the achievable power of frequency-doubled laser radiation increases strongly with the intensity of the fundamental laser radiation.

Enhancement cavities may be used to increase the achievable intensity of a laser beam in a nonlinear crystal. An enhancement cavity is an optical resonator that is impedance matched and resonant with an incident laser beam, often referred to as a pump beam. The optical resonator is defined by a set of mirrors. The set of mirrors may form a linear resonator where the pump beam bounces back and forth between two end-mirrors to form a standing wave. Alternatively, the set of mirrors may form a ring resonator where the pump beam circulates in one direction. In either case, when the optical resonator is resonant with the pump beam, constructive interference leads to enhancement of the intensity of the pump beam inside the optical resonator. The enhancement factor may be as large as 100, for example. Enhancement cavities are therefore useful for enhancing the intensity of a laser beam in a nonlinear crystal so as to significantly increase the power of a frequency-converted laser beam generated therefrom. The degree of intensity enhancement in an enhancement cavity is subject to the efficiency with which the pump beam is coupled into the optical resonator. For example, mode matching of the pump beam to the mode of the optical resonator is required for efficient input coupling.

Thermal lensing occurs in a nonlinear crystal when a laser beam propagating therein locally heats the material of the nonlinear crystal and thereby induces a gradient in the refractive index of the nonlinear crystal. The heating is caused by absorption of the laser radiation. Most commonly used nonlinear crystals exhibit relatively low absorption in the near-infrared and visible regions and more significant absorption in the ultraviolet region. Therefore, frequency conversion into the ultraviolet region is particularly prone to thermal lensing. However, thermal lensing may be non-negligible even in the visible region when the laser power is high.

SUMMARY OF THE INVENTION

Disclosed herein is a system for resonantly enhanced frequency conversion specifically configured to mitigate certain issues associated with thermal lensing. The presently disclosed system includes a nonlinear crystal positioned in an optical resonator tuned to be resonant with a pump laser beam (i.e., an enhancement cavity) for resonantly enhanced frequency conversion of the pump laser beam. The optical resonator is equipped with an adaptive mirror that compensates for thermal lensing in the nonlinear crystal in real time.

We have realized that, with a conventional enhancement cavity, variation in thermal lensing in the nonlinear crystal may preclude stable generation of the frequency-converted laser beam at a required power level and/or with required mode properties. This problem is most likely to arise when, for example, the frequency-converted laser beam is ultraviolet or when the average power of one or more of the involved laser beams is high, e.g., in the kilowatt range. We have further realized that one particularly detrimental effect of thermal lensing variation, when using a conventional enhancement cavity, is degradation of coupling of the incident pump beam into the optical resonator. In the conventional enhancement cavity, thermal lensing variation leads to variation in the mode of the optical resonator. This mode variation adversely affects mode-matching and thus in-coupling efficiency of the incident pump beam.

The degree of thermal lensing in a nonlinear crystal may change over time, both in the short term during burn-in of the nonlinear crystal and in the long term as the nonlinear crystal gradually degrades. Furthermore, the degree of thermal lensing is bound to change when the pump laser beam is first coupled into the enhancement cavity. Initially, there is no thermal lens. The thermal lens is formed only when the intracavity field builds up and, in some situations, only when frequency conversion begins to take place. Thus, successful operation of the enhancement cavity goes through an initial phase characterized by a strong increase in thermal lensing. In addition to temporal thermal-lensing variation, crystal-to-crystal variances as well as intra-crystal inhomogeneity may require tuning of the enhancement cavity.

Conventional enhancement cavities are not configured to adjust to variation in thermal lensing. In the presently disclosed system, on the other hand, the enhancement cavity includes an adaptive mirror that adaptively compensates for thermal lensing in the nonlinear crystal. The nonlinear crystal and the adaptive mirror are arranged such that the compensation performed by the adaptive mirror renders a segment of the propagation path of the pump laser beam inside the enhancement cavity insensitive, or at least less sensitive, to thermal lensing in the nonlinear crystal. The input coupler is placed in this insensitive, or less sensitive, segment of the propagation path to eliminate or at least reduce any effect of thermal lensing on the in-coupling efficiency. By virtue of being adaptive, the adaptive mirror is capable of maintaining the compensation in the presence of thermal lensing variation.

The adaptive mirror of the presently disclosed system is thermally actuated by a laser beam. We have found this approach to be preferable since it generates a lensing effect in the adaptive mirror that most closely resembles (with equal, but opposite, optical power) the nature of the thermal lensing in the nonlinear crystal, in terms of both spatial and temporal properties.

In one aspect, a system for resonantly enhanced frequency conversion with adaptive compensation for thermal lensing includes a nonlinear crystal for frequency converting a pump laser beam to an output laser beam, and a plurality of mirrors forming a ring resonator for the pump laser beam such that a closed propagation path of the pump laser beam, inside the ring resonator, passes through the nonlinear crystal. The plurality of mirrors include (a) an adaptive mirror, (b) a curved-mirror pair positioned in a first segment of the propagation path spanning between the adaptive mirror and the nonlinear crystal, and (c) an input coupler for coupling the pump laser beam into the ring resonator. The curved-mirror pair forms an imaging system having conjugate planes at the adaptive mirror and the nonlinear crystal. The input coupler is positioned in a second segment of the propagation path that spans between the adaptive mirror and the nonlinear crystal and does not include deflection by the curved-mirror pair. The system further includes an actuator coupled to one of the plurality of mirrors for keeping the ring resonator resonant with the pump laser beam. The adaptive mirror includes an absorber layer for generating heat from absorption of an external laser beam to thermally induce optical power in the adaptive mirror so as to compensate for thermal lensing in the nonlinear crystal.

BRIEF DESCRIPTION OF THE DRAWINGS

The accompanying drawings, which are incorporated in and constitute a part of the specification, schematically illustrate preferred embodiments of the present invention, and together with the general description given above and the detailed description of the preferred embodiments given below, serve to explain principles of the present invention.

DETAILED DESCRIPTION OF THE INVENTION

Figure 1:
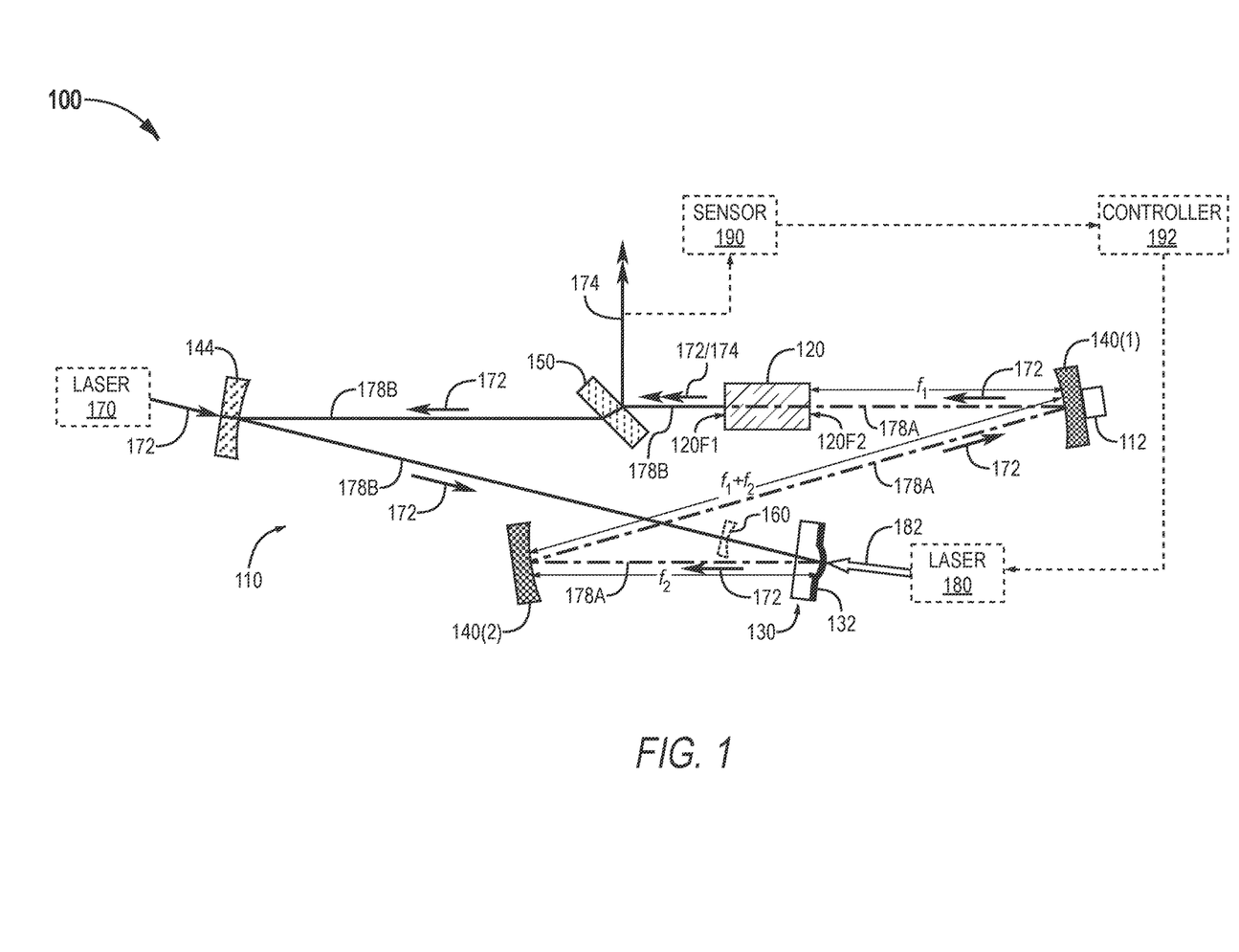
FIG. 1 illustrates a system for resonantly enhanced frequency conversion with adaptive compensation for thermal lensing, according to an embodiment.

Referring now to the drawings, wherein like components are designated by like numerals, FIG. 1 illustrates one system 100 for resonantly enhanced frequency conversion with adaptive compensation for thermal lensing. System 100 includes a nonlinear crystal 120 and a plurality of mirrors forming a ring resonator 110. The mirrors forming ring resonator 110 include an adaptive mirror 130, an input coupler 144, and two curved mirrors 140(1) and 140(2). Input coupler 144 couples a pump laser beam 172 into ring resonator 110. After in-coupling via input coupler 144, pump laser beam 172 circulates in ring resonator 110 along a closed intra-cavity propagation path 178 that is defined, at least in part, by input coupler 144, curved-mirror pair 140(1,2), and adaptive mirror 130. Propagation path 178 includes two segments 178A and 178B discussed in further detail below.

In the embodiment depicted in FIG. 1, input coupler 144, curved-mirror pair 140(1,2), and adaptive mirror 130 form a bow-tie cavity. Without departing from the scope hereof, ring resonator 110 may have a different layout and, for example, include additional mirrors that further fold propagation path 178 depicted in FIG. 1. The surface of input coupler 144 facing ring resonator 110 may be concave.

System 100 further includes an actuator 112 coupled to one of the mirrors forming ring resonator 110. In the embodiment depicted in FIG. 1, actuator 112 is coupled to curved mirror 140(1). Alternatively, actuator 112 is coupled to curved mirror 140(2) or another mirror not depicted in FIG. 1. Actuator 112 translates the location of the mirror to which it is connected, thereby changing the roundtrip length of ring resonator 110 as needed to keep ring resonator 110 resonant with pump laser beam 172. Ring resonator 110 thereby functions as an enhancement cavity. Actuator 112 may include a piezoelectric element coupled in a feedback circuit as known in the art.

Nonlinear crystal 120 is positioned in propagation path 178 to generate a frequency-converted output laser beam 174 from frequency conversion of pump laser beam 172. The frequency conversion taking place in nonlinear crystal 120 benefits from resonant enhancement of pump laser beam 172 inside ring resonator 110. Nonlinear crystal 120 may be configured to generate a frequency harmonic, e.g., a second-harmonic frequency, of pump laser beam 172. Alternatively, system 100 may be configured to frequency mix pump laser beam 172 with another laser beam (not shown in FIG. 1) in nonlinear crystal 120 so as to generate output laser beam 174 from sum- or difference-frequency mixing.

In one embodiment, pump laser beam 172 is a continuous-wave or pulsed laser beam with a wavelength in the infrared or visible region of the electromagnetic spectrum. In this embodiment, nonlinear crystal 120 may be configured to frequency double pump laser beam 172 so as to generate a frequency-converted output laser beam 174 in the visible or ultraviolet region. Optionally, system 100 includes a laser 170 that generates laser beam 172.

Curved-mirror pair 140(1,2) is positioned in a first segment 178A of propagation path 178. Segment 178A spans between a face 120F1 of nonlinear crystal 120 and adaptive mirror 130. As viewed along propagation path 178, face 120F1 faces input coupler 144, while face 120F2 at an opposite end of nonlinear crystal 120 faces curved-mirror pair 140(1,2). One or both of faces 120F1 and 120F2 may be at an oblique angle to propagation path 178. Along propagation path 178, curved mirror 140(1) is between nonlinear crystal 120 and curved mirror 140(2), while curved mirror 140(2) is between curved mirror 140(1) and adaptive mirror 130. Curved-mirror pair 140(1,2) forms an imaging system that has conjugate planes at nonlinear crystal 120 and adaptive mirror 130. Curved-mirror pair 140(1,2) thereby images the transverse profile of pump laser beam 172 from nonlinear crystal 120 to adaptive mirror 130.

In an ideal scenario, the thermal lens induced in nonlinear crystal 120 acts as a thin lens, and the optical power of adaptive mirror 130 has the same magnitude as that of the thermal lens induced in nonlinear crystal 120, but the opposite sign. In this ideal scenario, adaptive mirror 130 cancels the effect of the thermal lens in nonlinear crystal 120. Therefore, a segment 178B of propagation path 178, spanning between adaptive mirror 130 and face 120F1 of nonlinear crystal 120 via input coupler 144 (and not via curved-mirror pair 140(1,2)), is unaffected by the thermal lens in nonlinear crystal 120. As a result, mode-matching of pump laser beam 172 to the mode of ring resonator 110 at input coupler 144 is unaffected by the thermal lens in nonlinear crystal 120. In operation, when the optical power of the thermal lens in nonlinear crystal 120 varies, the optical power of adaptive mirror 130 is adjusted accordingly to render segment 178B insensitive to such thermal lens variation. For example, during the initial phase when pump laser beam 172 is first coupled into ring resonator 110 and the thermal lens develops in nonlinear crystal 120, adaptive mirror 130 may be adjusted to at least approximately maintain compensation for the thermal lens in nonlinear crystal 120.

In a non-ideal scenario, the focusing/defocusing action of adaptive mirror 130 only approximately cancels the thermal lens in nonlinear crystal 120. For example, the thermal lens in nonlinear crystal 120 may introduce aberrations beyond the capability of adaptive mirror 130 to cancel perfectly, and/or the thermal lens in nonlinear crystal 120 and the effective lens of adaptive mirror 130 may be aspheric to slightly different degrees. Also, the thermal lens is not equivalent to a thin lens, but is distributed along the length of nonlinear crystal 120. Yet, even in such scenarios, adaptive mirror 130 serves to at least reduce the sensitivity of segment 178B to thermal lensing in nonlinear crystal 120, so as to minimize any adverse effect of thermal lensing in nonlinear crystal 120 on in-coupling of pump laser beam 172.

System 100 is configured for propagation of pump laser beam 172 inside ring resonator 110 in a direction that corresponds to pump laser beam 172 entering nonlinear crystal 120 at face 120F2. As a result, output beam 174 emerges from nonlinear crystal 120 at face 120F1 collinearly with pump laser beam 172 or at a walk-off angle thereto. With this propagation direction of output laser beam 174, system 100 may advantageously include an output coupler 150 positioned in segment 178B, such that the beam parameters of output laser beam 174 also benefit from the insensitivity (or reduced sensitivity) of segment 178B to thermal lensing in nonlinear crystal 120.

The sign of the thermal lens in nonlinear crystal 120 is a material property. In one embodiment, nonlinear crystal 120 is composed of a material that causes the thermal lens to be a negative lens. Nonlinear crystal 120 is, for example, a beta barium borate (BBO) crystal. In this embodiment, adaptive mirror 130 is configured to have optical power that is adjustable from zero to a positive maximum value. In another embodiment, nonlinear crystal 120 is composed of a material that causes the thermal lens to be a positive lens, such as potassium titanyl phosphate (KTP). In this embodiment, adaptive mirror 130 is configured to have optical power that is adjustable from zero to a negative maximum value.

The focusing/defocusing by adaptive mirror 130 is thermally actuated by an external laser beam 182. Adaptive mirror 130 includes an absorber layer 132 that is absorptive to laser beam 182. Absorber layer 132 may be composed of or include amorphous silicon. When irradiated by laser beam 182, absorber layer 132 heats up and causes a local thermal expansion and/or a local change in refractive index in adaptive mirror 130, resulting in a non-zero optical power. Many different types of adaptive mirrors have been developed and are even commercially available. The most common adaptive mirrors are based on micro-electro-mechanical systems (MEMS) technology and include an array of MEMS actuators arranged to deform a mirror surface. However, we have found that for optimal compensation of the thermal lens in nonlinear crystal 120, it is advantageous to use an actuation technique that is similar to the phenomenon causing the thermal lens in nonlinear crystal 120. The thermal lens in nonlinear crystal 120 is caused by laser beam absorption and associated local heating. We have found that actuation of adaptive mirror 130 by laser-beam heating can generate an effective lens (reflective or refractive) with spatial properties closely resembling those of the thermal lens in nonlinear crystal 120 (but with opposite optical power). Furthermore, laser-beam-heating based actuation of adaptive mirror 130 is inherently adjustable on a timescale similar to the timescale of thermal lens variation in nonlinear crystal 120. An embodiment of adaptive mirror 130 having negative optical power is discussed in further detail below in reference to FIGS. 3A, 3B, and 4. Embodiments of adaptive mirror 130 having positive optical power are discussed in further detail below in reference to FIGS. 5A, 5B, 6, and 7.

System 100 may include a laser 180 that generates external laser beam 182. Laser 180 may be a diode laser, such as a blue, cyan, or green diode laser. For example, a diode laser with a continuous-wave power in the range between 50 milliwatts and 5 watts. System 100 may also include a sensor 190 and a controller 192. Sensor 190 measures a property of either pump laser beam 172 or output laser beam 174 indicative of the quality of thermal lensing compensation performed by adaptive mirror 130. Controller 192 adjusts laser 180 according to the property measured by sensor 190, so as to actively optimize the thermal lensing compensation performed by adaptive mirror 130. For example, controller 192 may adjust the power of laser beam 182.

In a first implementation, sensor 190 includes a camera that images a portion of output laser beam 174 in the far field (for example as facilitated by a lens), and controller 192 adjusts laser 180 to maintain a desired transverse far-field mode property of output laser beam 174. In a second implementation, sensor 190 includes (a) a first detector that measures the total power of a portion of output laser beam 174 and (b) a second detector that measures the power of another portion output laser beam 174 transmitted by a pinhole. The ratio between the powers measured by the first and second detectors is indicative of a beam diameter or similar property of output laser beam 174. In this implementation, controller 192 adjusts laser 180 to maintain this ratio at a desired level. In each of these first and second implementations, the portion of output laser beam 174 probed by sensor 190 may be obtained from the path of output laser beam 174 extracted from ring resonator 110 by output coupler 150.

In another type of implementation, output coupler 150 further extracts (e.g., incidentally) a small portion of the power of pump laser beam 172 from ring resonator 110. In this implementation, the feedback loop formed by sensor 190 and controller 192 is based, at least in part, on sensor 190 probing the extracted portion of pump laser beam 172 to more directly assess the mode properties of pump laser beam 172 in segment 178B. System 100 may include (a) a beamsplitter that separates the out-coupled portion of pump laser beam 172 from output laser beam 174 and (b) a lens that focuses the out-coupled portion of pump laser beam 172 on a camera of sensor 190. Alternatively, this implementation is based on a small portion of the power of pump laser beam 172 incidentally leaked out of ring resonator 110 by one of the mirrors forming ring resonator 110, for example curved mirror 140(1), curved mirror 140(2), or input coupler 144.

Curved-mirror pair 140(1,2) may be configured as a 4f imaging system. In such embodiments, each of curved mirrors 140(1) and 140(2) is a concave mirror, curved mirror 140(1) has focal length $f_1$, curved mirror 140(2) has focal length $f_2$, the distance from nonlinear crystal 120 to curved mirror 140(1) equals the focal length $f_1$ of curved mirror 140(1), the distance from curved mirror 140(2) to adaptive mirror 130 equals the focal length of $f_2$ curved mirror 140(2), and the distance from curved mirror 140(1) to curved mirror 140(2) equals $f_1+f_2$. When $f_1=f_2$, curved-mirror pair 140(1,2) images the transverse profile of pump laser beam 172 from nonlinear crystal 120 to adaptive mirror 130 with unity magnification. However, it may be advantageous to magnify the image of pump laser beam 172 at adaptive mirror 130, for example when the spatial resolution of adaptive mirror 130 would otherwise be insufficient. Thus, in one embodiment, $f_2$ is greater than $f_1$. Alternatively, when deemed preferable, $f_1$ is greater than $f_2$.

Depending on the exact properties of the thermal lens in nonlinear crystal 120, optimal imaging by the 4f imaging system may be achieved when curved mirror 140(1) is one focal length $f_1$ away, in terms of optical path length, from (a) face 120F1 of nonlinear crystal 120, (b) the center of nonlinear crystal 120, or (c) another location in nonlinear crystal 120 between faces 120F1 and 120F2. Similarly, depending on the configuration of adaptive mirror 130, the optimal position of curved mirror 140(2) for 4f imaging may be one focal length $f_2$ away from (a) a reflective surface of adaptive mirror 130 or (b) another location in adaptive mirror 130.

Figure 2:
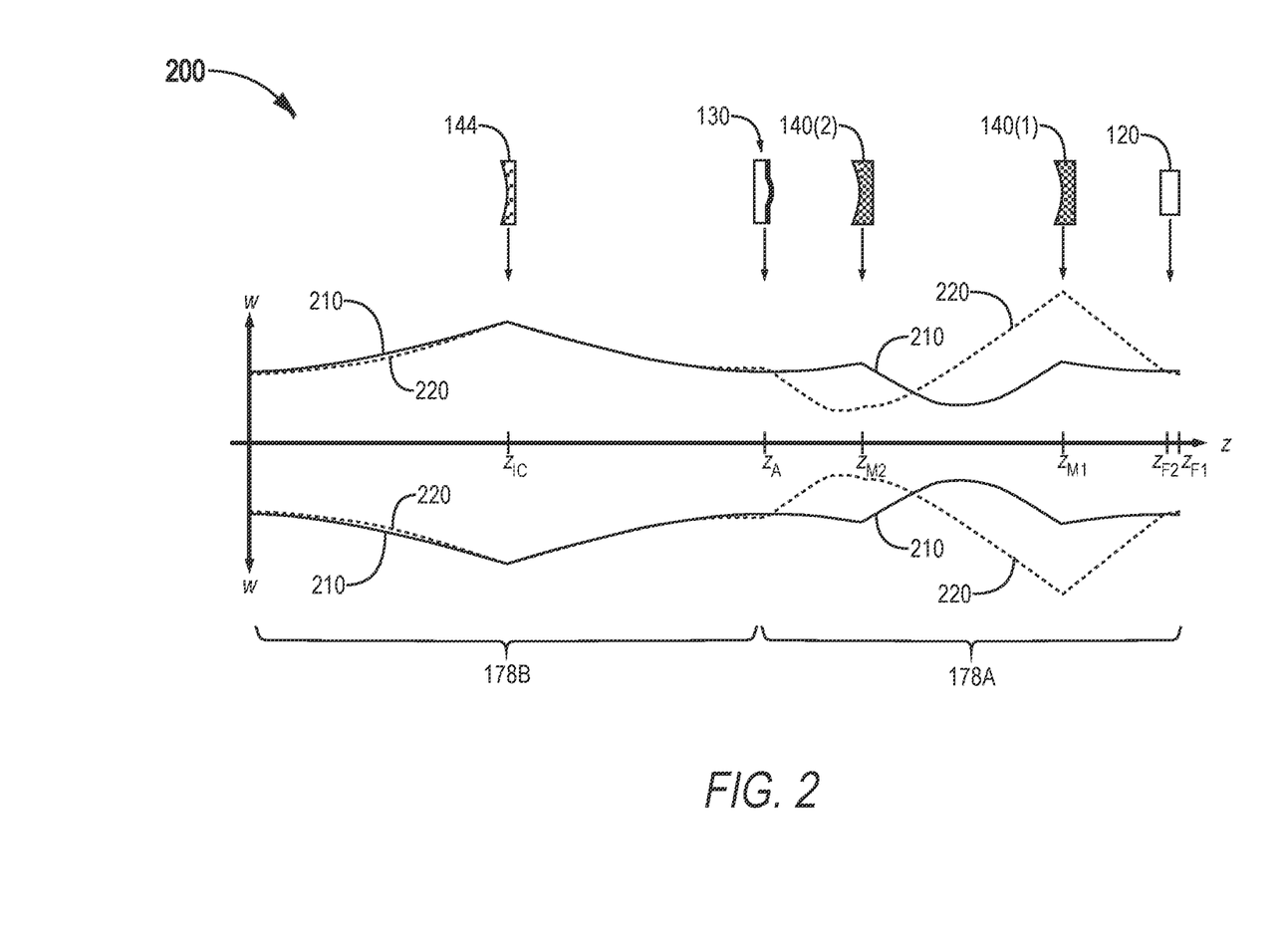
FIG. 2 is a plot of transverse profiles of the pump laser beam vs. location within an example of the ring resonator of the FIG. 1 system, in the presence and absence of thermal lensing in the nonlinear crystal.

FIG. 2 is a plot 200 of transverse profiles of pump laser beam 172 in one example of ring resonator 110, in the presence and absence of thermal lensing in nonlinear crystal 120. In plot 200, z indicates the position along propagation path 178, with z=0 and $z=z_{F1}$ coinciding with face 120F1 of nonlinear crystal 120. In a roundtrip of pump laser beam 172 through ring resonator 110 starting from face 120F1, pump laser beam 172 propagates to input coupler 144 at $z=z_{IC}$, then to adaptive mirror 130 at $z=z_A$, then via curved mirror 140(2) at $z=z_{M2}$ and curved mirror 140(1) at $z=z_{M1}$ to face 120F2 of nonlinear crystal 120 at $z=z_{F2}$, and finally through nonlinear crystal 120 from face 120F2 to face 120F1 at $z=z_{F1}$. The optical path length from $z=z_A$ to $z=z_{M2}$ matches the focal length of curved mirror 140(2), the optical path length from $z=z_{M2}$ to $z=z_{M1}$ matches the sum of the focal lengths of curved mirrors 140(1) and 140(2), and the optical path length from $z=z_{M1}$ to $z=z_{F2}$ matches the focal length of curved mirror 140(1). This design of ring resonator 110 images the transverse profile of pump laser beam 172 at face 120F2 of nonlinear crystal 120 to adaptive mirror 130.

Transverse profile 210 (solid curves) pertains to a situation with no thermal lensing in nonlinear crystal 120. Transverse profile 220 (dashed curves) pertains to a situation with negative thermal lensing in nonlinear crystal 120, wherein the negative thermal lens is characterized by uniform optical power distributed along propagation path 178 between faces 120F1 and 120F2. For each of transverse profiles 210 and 220, the $1/e^2$ transverse envelope w(z) of pump laser beam 172 is bounded by the associated curve above the z-axis and the associated curve below the z-axis.

In the situation with no thermal lensing in nonlinear crystal 120 (transverse profile 210), adaptive mirror 130 has zero optical power. In the situation with negative thermal lensing in nonlinear crystal 120 (transverse profile 220), nonlinear crystal 120 has an optical power of −20 diopters ($m^{-1}$) and adaptive mirror 130 has an optical power of +20 $m^{-1}$. While transverse profiles 210 and 220 deviate strongly from each other in segment 178A, they are nearly identical throughout segment 178B. This example demonstrates excellent insensitivity of segment 178B to thermal lensing in nonlinear crystal 120.

In one modification of the example of ring resonator 110 producing the transverse profiles plotted in FIG. 2, the optical path length from $z=z_{M1}$ to $z=z_{F1}$ matches the focal length of curved mirror 140(1), such that curved-mirror pair 140(1,2) images the transverse profile of pump laser beam 172 at face 120F1 (rather than face 120F2) of nonlinear crystal 120 to adaptive mirror 130. At first glance, this may appear to be a better design, since nonlinear crystal 120 would be completely outside segment 178B, which is the segment that the present approach seeks to render insensitive to thermal lensing in nonlinear crystal 120. The mode matching and in-coupling efficiency at input mirror 144 would be less affected by any imperfect compensation of the thermal lens within nonlinear crystal 120. However, our investigations have shown that the exact positioning of this conjugate plane in nonlinear crystal 120 has relatively little effect on degree of sensitivity of segment 178B to thermal lensing in nonlinear crystal 120.

Figure 3A:
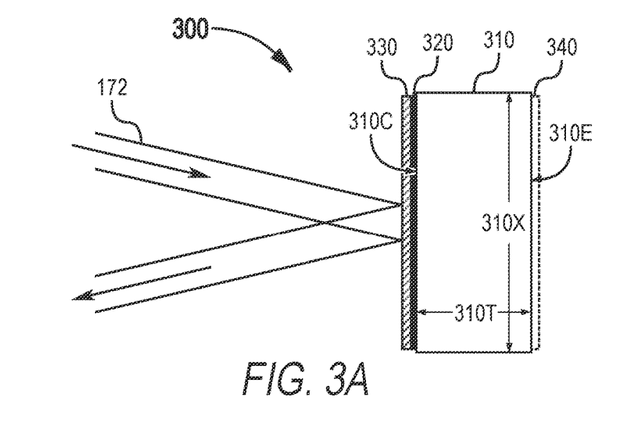
FIGS. 3A and 3B illustrate an adaptive mirror configured to have zero or negative optical power, according to an embodiment.
Figure 3B:
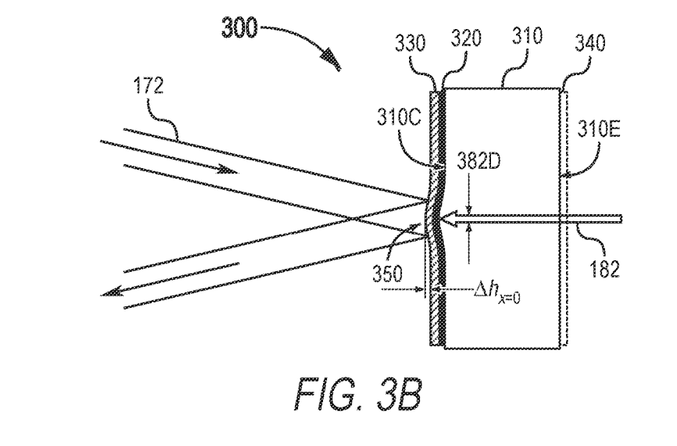

FIGS. 3A and 3B illustrate one adaptive mirror 300 configured to have zero or a selected negative optical power. FIG. 3A shows adaptive mirror 300 in a non-heated state where adaptive mirror 300 has zero, or negligible, optical power. FIG. 3B shows adaptive mirror 300 in a heated state where adaptive mirror has negative optical power. Adaptive mirror 300 is an embodiment of adaptive mirror 130 suitable for implementation in an embodiment of system 100 where nonlinear crystal 120 exhibits positive thermal lensing.

Adaptive mirror 300 includes a substrate 310 having two opposite facing surfaces 310C and 310E. When implemented in system 100, surfaces 310C and 310E respectively face toward and away from pump laser beam 172 as incident on adaptive mirror 300. Surfaces 310C and 310E may be planar and parallel when adaptive mirror 300 is in its non-heated state, as shown in FIG. 3A. Adaptive mirror 300 further includes an absorber layer 320 disposed on surface 310C, and a reflective coating 330 disposed on absorber layer 320. Reflective coating 330 is reflective to pump laser beam 172, for example with a reflection coefficient of 98% or more. Adaptive mirror 300 may also include an anti-reflective coating 340 disposed on surface 310E to minimize reflection of external laser beam 182 at surface 310E. Although not depicted in FIGS. 3A and 3B, adaptive mirror 300 may include additional layers, for example at one or more interfaces between reflective coating 330, absorber layer 320, substrate 310, and anti-reflective coating 340.

Absorber layer 320 is an embodiment of absorber layer 132. In operation, external laser beam 182 propagates through substrate 310 to be at least partly absorbed by absorber layer 320. Upon irradiation by external laser beam 182, the temperature of absorber layer 320 increases locally. Thermal diffusion into substrate 310 leads to a locally increased temperature in substrate 310, at the location where external laser beam 182 is incident on absorber layer 320, and a temperature gradient thereabout. Substrate 310 has a non-negligible coefficient of thermal expansion (CTE), and surface 310C therefore bulges outward (toward pump laser beam 172) to form a convex region 350. Adaptive mirror 300 is located so that pump laser beam 172 is incident on convex region 350 and reflective coating 330 thereon. Thus, when irradiated by external laser beam 182, adaptive mirror 300 has a negative optical power.

In one implementation, substrate 310 is made of a glass having a CTE in the range between $5 \times 10^{-6}$ reciprocal kelvin ($K^{-1}$) and $15 \times 10^{-6} K^{-1}$, for example a borosilicate glass. Substrate 310 has a thickness 310T and a transverse extent 310X. Transverse extent 310X may be a diameter, in the case of substrate 310 being circular. Transverse extent 310X exceeds the $1/e^2$ transverse size of pump laser beam 172 incident on adaptive mirror 300. Transverse extent 310X is, for example, in the range between 10 mm and 25.4 mm. Thickness 310T may be a standard substrate thickness, such as 3 mm or 6 mm, or another value in the range between 2 and 10 mm.

In one example, absorber layer 320 is composed of amorphous silicon. In this example, absorber layer 320 may have a thickness in the range between 100 and 250 nanometers (nm), to maximize absorption of external laser beam 182 while minimizing the thickness of absorber layer 320.

The spot size 382D of external laser beam 182 at absorber layer 320 may be on the same order of magnitude as the spot size of pump laser beam 172 on reflective coating 330. In one scenario, spot size 382D is (a) at least 100 micrometers (µm) to ensure that the extent of convex region 350 is similar to or greater than the $1/e^2$ transverse size of pump laser beam 172, and (b) less than 500 µm to ensure sufficient curvature of convex region 350 within the $1/e^2$ transverse size of pump laser beam 172. System 100 may include a lens that focuses external laser beam 182 onto absorber layer 320 to achieve a desired spot size. The transverse intensity distribution of external laser beam 182 may be tailored as needed to form convex region 350 with a desired curvature. In one example of use, external laser beam 182 is Gaussian at absorber layer 320. In another example of use, external laser beam 182 has a flat-top transverse profile at absorber layer 320 (i.e., uniform intensity within spot size 382D and zero intensity elsewhere).

Figure 4:
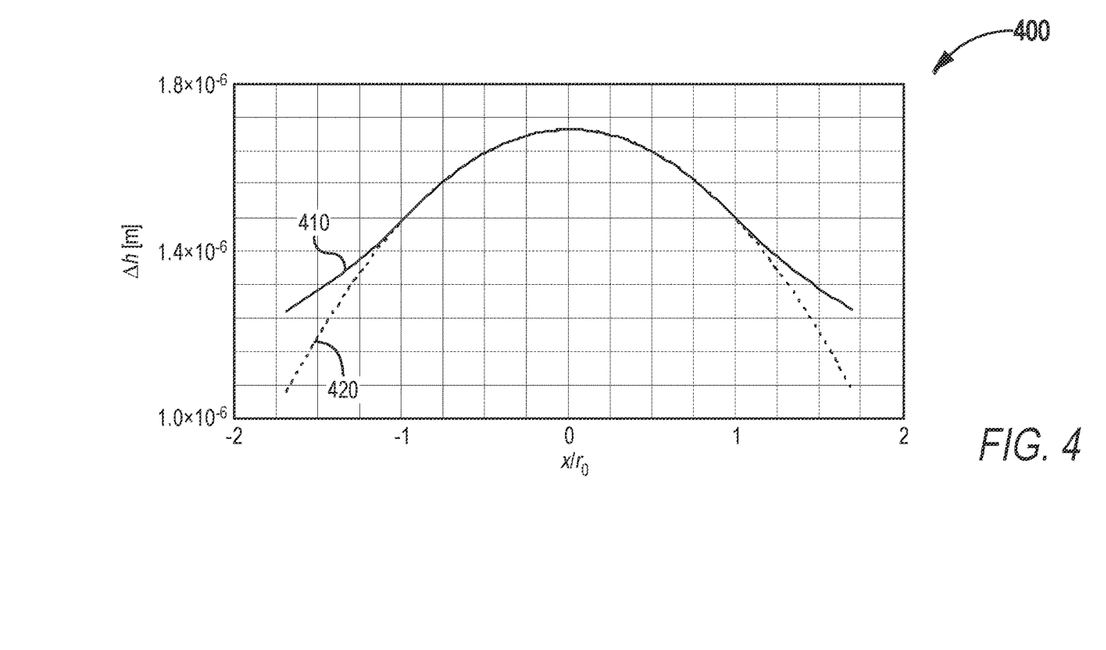
FIG. 4 is a plot of an example of relative surface height vs. radial location for the adaptive mirror of FIGS. 3A and 3B when irradiated by an external laser beam.

FIG. 4 is a plot 400 of an example relative surface height $\Delta h$ of adaptive mirror 300 at reflective coating 330 when adaptive mirror 300 is irradiated by external laser beam 182. In this example, substrate 310 is a borosilicate glass substrate with a 6 mm thickness 310T, a 12.7 mm diameter 310X, and a CTE of $8.3 \times 10^{-6} K^{1}$, absorber layer 320 is an amorphous silicon layer with a thickness of 200 nm, and external laser beam 182 is a continuous-wave laser beam with a wavelength of 444 nm, a power of 1.5 watts, and a flat-top transverse profile with a radius $r_0$ of 350 µm at absorber layer 320.

Plot 400 depicts surface height $\Delta h$ as a function of normalized radial position $x/r_0$ in the dimension parallel to surface 310C when adaptive mirror 300 is in its heated state. A uniform surface height $\Delta h$ of zero corresponds to surface 310C being planar (when external laser beam 182 is not irradiating adaptive mirror 300). The position x=0 corresponds to the optical axis of external laser beam 182. In plot 400, the position x is normalized to the radius of external laser beam 182 at absorber layer 320. Curve 410 indicates the modeled surface height $\Delta h$. Curve 420 indicates a parabolic surface height fitted to the modeled surface height.

The maximum surface height $\Delta h$ is attained at x=0 (see FIG. 3B) and has a value of approximately 1.7 µm. Within the boundary of external laser beam 182, the modeled surface height $\Delta h$ is parabolic. The thermal lens in nonlinear crystal 120 is expected to be approximately parabolic. Outside the boundary of external laser beam 182, the modeled surface height $\Delta h$ deviates from the parabolic profile and instead exhibits an approximately logarithmic profile.

Figure 5A:
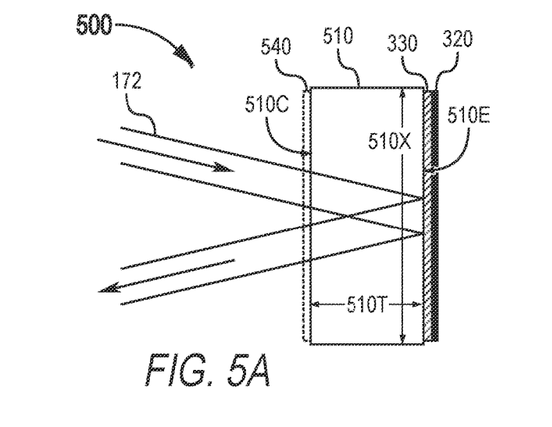
FIGS. 5A and 5B illustrate an adaptive mirror configured to have zero or positive optical power, according to an embodiment.
Figure 5B:
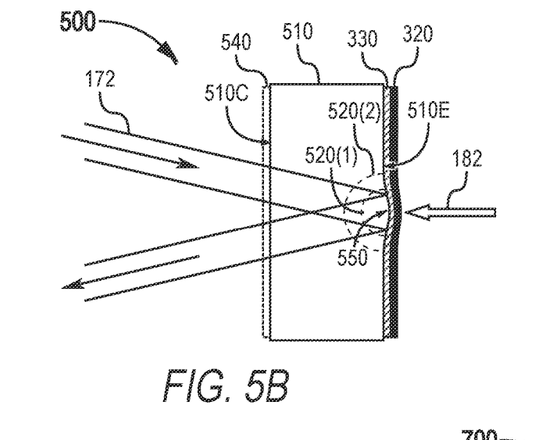

FIGS. 5A and 5B illustrate one adaptive mirror 500 configured to have zero or a selected positive optical power. FIG. 5A shows adaptive mirror 500 in a non-heated state where adaptive mirror 500 has zero, or negligible, optical power. FIG. 5B shows adaptive mirror 500 in a heated state where adaptive mirror has positive optical power. Adaptive mirror 500 is an embodiment of adaptive mirror 130 suitable for implementation in an embodiment of system 100 where nonlinear crystal 120 exhibits negative thermal lensing.

Adaptive mirror 500 includes a substrate 510 having two opposite facing surfaces 510C and 510E. When adaptive mirror 500 is implemented in system 100, surfaces 510C and 510E respectively face toward and away from pump laser beam 172 as incident on adaptive mirror 500. Surfaces 510C and 510E may be planar and parallel, at least when adaptive mirror 500 is in its non-heated state (see FIG. 5A). Adaptive mirror 500 further includes reflective coating 330 disposed on surface 510E, and absorber layer 320 disposed on reflective coating 330. Preferably, adaptive mirror 500 also includes an anti-reflective coating 540 disposed on surface 510C to minimize reflection of pump laser beam 172 at surface 510C, such that pump laser beam 172 is maximally transmitted through substrate 510 to reflective coating 330. Without departing from the scope hereof, adaptive mirror 500 may include additional layers, for example at one or more interfaces between anti-reflective coating 540, substrate 510, reflective coating 330, and absorber layer 320.

In operation, pump laser beam 172 enters substrate 510 through surface 510C and then propagates through substrate 510 to surface 510E to be reflected by reflective coating 330 before exiting substrate 510 again through surface 510C. External laser beam 182 is incident on adaptive mirror 500 in the direction toward surface 510E and is at least partly absorbed by absorber layer 320. Upon irradiation by external laser beam 182, the temperature of absorber layer 320 increases locally. Thermal diffusion into substrate 510 leads to a locally increased temperature in substrate 510 near the location where external laser beam 182 is incident on absorber layer 320. Substrate 510 is characterized by one or both of a non-negligible CTE and a non-negligible positive thermo-optic coefficient.

When substrate 510 has a non-negligible CTE, irradiation by external laser beam 182 leads to local thermal expansion of substrate 510 near the location where external laser beam 182 is incident on absorber layer 320. As viewed from pump laser beam 172, the resulting bulging of substrate 510 forms a concave region 550 in the surface of reflective coating 330 facing pump laser beam 172. Thus, the non-negligible CTE results in adaptive mirror 500 having positive optical power when irradiated by external laser beam 182.

When substrate 510 has a non-negligible positive thermo-optic coefficient, the local temperature increase in substrate 510 results in a locally increased refractive index of substrate 510 and a refractive index gradient, as schematically indicated by refractive-index contour lines 520(1) and 520(2) in FIG. 5B. In this situation, the refractive index is larger inside contour line 520(1), near the portion of absorber layer 320 directly heated by external laser beam 182, and gradually decreases in directions away from this region. The refractive index gradient amounts to an effective non-uniform increase in the optical path length experienced by pump laser beam 172 at and near its reflection off reflective coating 330, corresponding to positive optical power.

Whether the optical power of adaptive mirror 500 is due to non-negligible CTE or thermo-optic coefficient depends on the material of substrate 510. For some materials, the optical power is primarily caused by a non-negligible CTE. For other materials, the optical power is primarily caused by a non-negligible thermo-optic coefficient. For materials characterized by both the CTE and the thermo-optic coefficient being non-negligible, the optical power is attributed to a combination of thermal expansion and a thermally-induced refractive index gradient.

A variety of considerations may dictate the material choice for substrate 510, in particular the fact that pump laser beam 172 passes through substrate 510 twice for each roundtrip in ring resonator 110. Maintaining a high finesse of adaptive mirror 500 therefore requires that substrate 510 has low absorption at the wavelength of pump laser beam 172. Also, materials with non-negligible negative thermo-optic coefficients may be unsuitable, since heating of such materials induce negative optical power in substrate 510. Borosilicate glass and fused silica both have a positive thermo-optic coefficient and are therefore possible material choices for substrate 510. However, at least in the visible region, the absorption coefficient of fused silica is lower than that of borosilicate glass, and fused silica may therefore be preferable over borosilicate glass. The CTE of fused silica is relatively low, with a value of only $0.55 \times 10^{-6} K^{-1}$, and the optical power of an embodiment of adaptive mirror 500 based on a fused silica substrate is dominated by a thermally-induced refractive index gradient. The higher CTE of borosilicate glass means that both thermal expansion and thermally-induced refractive index gradient contribute substantially to the optical power of an embodiment of adaptive mirror 500 based on a borosilicate glass.

The dimensions 510T and 510X of substrate 510 may be similar to dimensions 310T and 310X, respectively, of substrate 310. The thickness and material of absorber layer 320 in adaptive mirror 500 may be as discussed above in reference to adaptive mirror 300.

Figure 6:
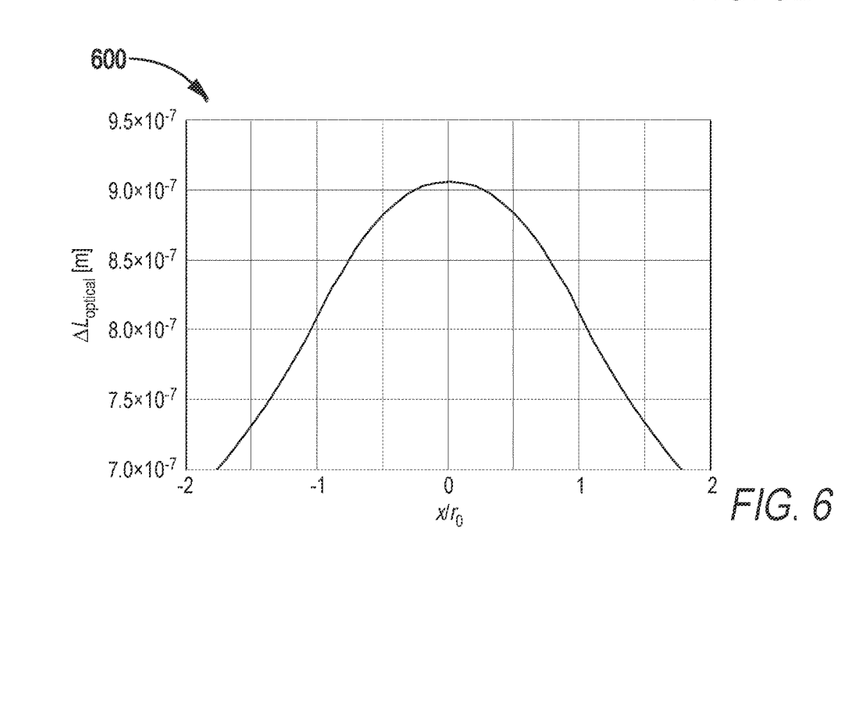
FIG. 6 is a plot of additional optical path length vs. radial location that illustrates the effect of a thermally induced refractive index gradient in one example of the adaptive mirror of FIGS. 5A and 5B based on a fused silica substrate.

FIG. 6 is a plot 600 that illustrates the effect of a thermally-induced refractive index gradient in one example of adaptive mirror 500 based on a fused silica substrate. Plot 600 depicts the change in optical path length $\Delta L_{optical}$ of pump laser beam 172 in substrate 510 as a function of radial position x when adaptive mirror 500 is irradiated by external laser beam 182. (The position x is defined as discussed above in reference to FIG. 4, except for being referenced to surface 510E in a non-heated state of adaptive mirror 500. The horizontal axis of plot 600 indicates the position x as normalized to the radius $r_0$ of external laser beam 182 at absorber layer 320.)

In the FIG. 6 example, substrate 510 is a fused silica substrate with a 6 mm thickness 510T, a 12.7 mm diameter 510X, a CTE of $0.55 \times 10^{-6} K^{-1}$, a positive thermo-optic coefficient of $12.6 \times 10^{-6} K^{-1}$ (at 300 K), absorber layer 320 is an amorphous silicon layer with a thickness of 300 nm, external laser beam 182 is a continuous-wave laser beam with a wavelength between 488 and 532 nm, a power of 100 milliwatts, and a flat-top transverse profile with a 200-μm radius $r_0$, and pump laser beam 172 has a wavelength of 426 nm and is incident on surface 510C at an incidence angle of 14 degrees. The resulting change in optical path length $\Delta L_{optical}$ corresponds to adaptive mirror 500 acting as a positive lens with a relatively longer optical path length near the optical axis of external laser beam 182 as extended into substrate 510.

Figure 7:
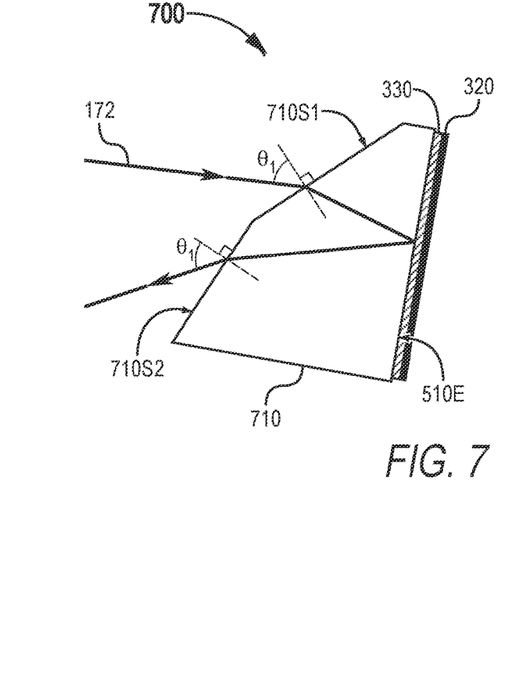
FIG. 7 illustrates a Brewster-cut adaptive mirror configured to have zero or positive optical power, according to an embodiment.

FIG. 7 illustrates a Brewster-cut adaptive mirror 700 configured to have zero or positive optical power. Adaptive mirror 700 is a modification of adaptive mirror 500 that minimizes undesirable partial reflection by arranging relevant surface portions such that pump laser beam 172 is incident at Brewster's angle. Adaptive mirror 700 replaces substrate 510 of adaptive mirror 500 with a substrate 710 that, in place of surface 510C, has two planar but non-parallel surfaces 710S1 and 710S2. When implemented in system 100, adaptive mirror 700 is arranged such that pump laser beam 172 is incident on surface 710S1 at an incidence angle $\theta_1$ that matches Brewster's angle for the air-to-substrate interface. After reflection by reflective coating 330, pump laser beam 172 exits substrate 710 through surface 710S2. Surface 710S2 is oriented such that pump laser beam 172 emerges from surface 710S1 (from within substrate 710) at the angle $\theta_1$ matching Brewster's angle. Adaptive mirror 700 thereby minimizes and potentially even eliminates partial reflection of pump laser beam 172 upon entry into and exit out of adaptive mirror 700. Adaptive mirror 700 does not require an anti-reflective coating on surfaces 710S1 and 710S2.

Figure 8:
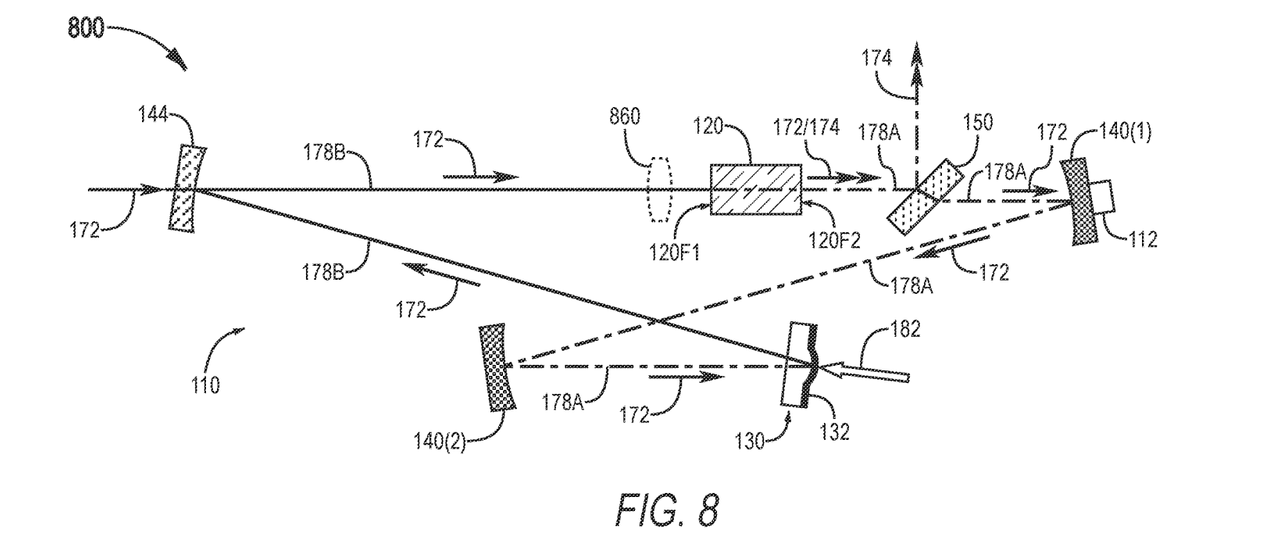
FIG. 8 illustrates another system for resonantly enhanced frequency conversion with adaptive compensation for thermal lensing, according to an embodiment.

FIG. 8 illustrates another system 800 for resonantly enhanced frequency conversion with adaptive compensation for thermal lensing. System 800 is similar to system 100 except for specific differences noted in the following. As compared to system 100, system 800 is configured for propagation of pump laser beam 172 in the opposite direction around ring resonator 110. Therefore, system 800 places output coupler 150 in segment 178A of propagation path 178 between nonlinear crystal 120 and curved mirror 140(1). Consequently, system 800, in contrast to system 100, does not benefit from output coupler 150 being positioned in segment 178B that is insensitive (or at least less sensitive) to thermal lensing in nonlinear crystal 120. The transverse mode of output laser beam 174 may therefore be affected by thermal lensing in nonlinear crystal 120. In use scenarios where the transverse mode properties of output laser beam 174 are not critical, this location of output coupler 150 is acceptable.

While the potentially compromised transverse mode of output laser beam 174 may be a disadvantage in some scenarios, system 800 allows for improved control of the caustic of laser beam 172 in nonlinear crystal 120 to improve the frequency-conversion efficiency in nonlinear crystal 120. In the example of system 100 investigated in FIG. 2, and in the absence of thermal lensing in nonlinear crystal 120, laser beam 172 forms a waist near face 120F1 of nonlinear crystal 120 and is nearly collimated through nonlinear crystal 120. In the presence of substantial negative thermal lensing in nonlinear crystal 120, the transverse size of laser beam 172 increases significantly in the direction from face 120F1 to face 120F2. This beam divergence reduces the frequency-conversion efficiency in nonlinear crystal 120, because the beam divergence exceeds the angle of acceptance of the frequency-conversion process. Therefore, adjustment of the waist location in nonlinear crystal 120 may be advantageous. The configuration of system 800 is compatible with such adjustment using a second compensation optic 860 in propagation path 178 between input coupler 144 and nonlinear crystal 120.

Compensation optic 860 serves to force the waist of pump laser beam 172 to be at a desired location within nonlinear crystal 120, e.g., at the center. Compensation optic 860 may be a lens or another optical element with non-zero and/or adjustable optical power.

In one implementation, compensation optic 860 is located very close to face 120F1 of nonlinear crystal 120. In another implementation, system 800 further includes imaging optics (not shown in FIG. 8) that image face 120F1 of nonlinear crystal 120 to a more distant location of compensation optic 860. For example, although not shown in FIG. 8, ring resonator 110 may include a second pair of curved mirrors that image the transverse profile of pump laser beam 172 from nonlinear crystal 120 to compensation optic 860, in a manner similar to imaging performed by curved-mirror pair 140(1,2). This second pair of curved mirrors would add complexity to system 800 but allow for improved accuracy in the achieved compensation, especially when it is not possible to position compensation optic 860 very close to nonlinear crystal 120.

In each of these two implementations, a centered location of the waist of pump laser beam 172 in nonlinear crystal 120 may be achieved. As the power of pump laser beam 172 builds up in ring resonator 110, the optical power of compensation optic 860 may be adjusted to approximately equal that of adaptive mirror 130, while maintaining the sum of the optical powers of compensation optic 860 and adaptive mirror 130 at approximately the same magnitude as that of thermal lensing in nonlinear crystal 120 but with the opposite sign. A different, e.g., non-centered, waist location in nonlinear crystal 120 may be achieved by a different balance between the optical powers of compensation optic 860 and adaptive mirror 130.

As an alternative to a separate compensation optic 860, face 120F1 of nonlinear crystal 120 may be convex. While this solution minimizes the number of optical elements, performing the compensation with a separate compensation optic 860 allows for adjusting or replacing the compensation optic 860 as needed to impose a desired optical power.

Figure 9:
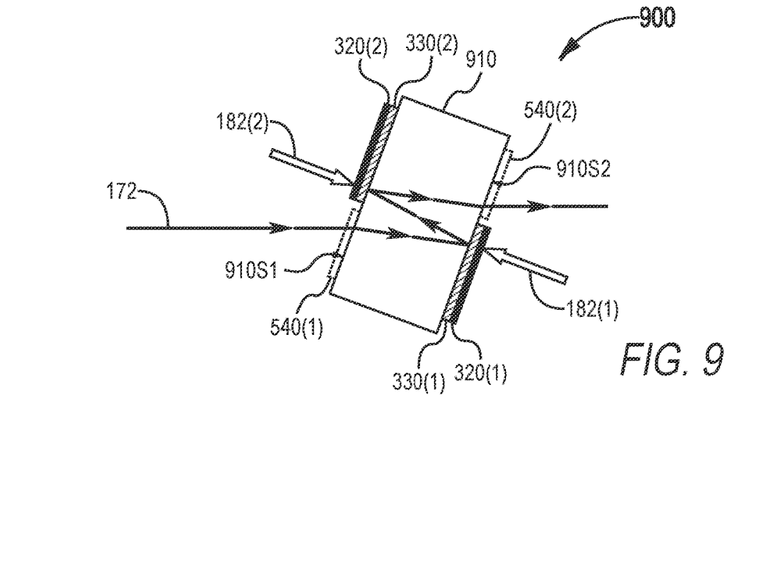
FIG. 9 illustrates an adaptive optic suitable for implementation in the FIG. 8 system as a compensation optic, according to an embodiment.

FIG. 9 illustrates one adaptive optic 900 suitable for implementation in system 800 as compensation optic 860 near face 120F1 of nonlinear crystal 120, wherein nonlinear crystal 120 exhibits negative thermal lensing. Adaptive optic 900 is configured to be thermally actuated by an external laser beam, similarly to the thermal actuation of adaptive optic 500. Adaptive optic 900 has positive optical power when heated by the external laser beam.

Adaptive optic 900 includes a substrate 910 that is planar when not subjected to laser beam heating. Substrate 910 has two opposite-facing surfaces 910S1 and 910S2. Adaptive optic 900 further includes a first instance of reflective coating 330(1) on surface 910S2, and a second instance of reflective coating 330(2) on surface 910S1. Adaptive optic 900 also includes one or both of (a) a first instance of absorber layer 320(1) on reflective coating 330(1) on surface 910S2 and (b) a second instance of absorber layer 320(2) on reflective coating 330(2) on surface 910S1. Preferably, adaptive optic 900 further includes a first instance of anti-reflective coating 540(1) on surface 910S1 and a second instance of anti-reflective coating 540(2) on surface 910S2.

In operation, pump laser beam 172 is incident on adaptive optic 900 at surface 910S1 (on anti-reflective coating 540 (1), when included), propagates through substrate 910 to be reflected by reflective coating 330(1) at surface 910S2 and thereby directed through substrate 910 again to be reflected by reflective coating 330(2) at surface 910S1 before leaving substrate 910 at surface 910S2 (via anti-reflective coating 540(2), when included). One or both of absorber layers 320(1) and 320(2) is heated by a respective external laser beam 182 to induce positive optical power. In effect, adaptive optic 900 is an extension of adaptive mirror 500 where pump laser beam 172 makes an additional second pass through the substrate and may be subjected to a focusing effect twice instead of just once. While a similar optical power may be achieved with adaptive mirror 500, implementation of adaptive mirror 500 in propagation path 178 near face 120F1 of nonlinear crystal 120 would require a folding mirror that precludes placement of adaptive mirror 500 very close to nonlinear crystal 120. Implementation of adaptive optic 900 does not require such a folding mirror, and adaptive optic 900 may therefore advantageously be located closer to nonlinear crystal 120.

As an alternative to the waist-location adjustment achieved with system 800 configured with compensation optic 860, system 100 (see FIG. 1) may implement a compensation optic 160 in propagation path 178 between adaptive mirror 130 and input coupler 144. For example, implementation of compensation optic 160 as a negative lens shifts the waist location in nonlinear crystal 120.

The present invention is described above in terms of a preferred embodiment and other embodiments. The invention is not limited, however, to the embodiments described and depicted herein. Rather, the invention is limited only by the claims appended hereto.

What is claimed is:

1. A system for resonantly enhanced frequency conversion with adaptive compensation for thermal lensing, comprising:
    a nonlinear crystal for frequency converting a pump laser beam to an output laser beam;
    a plurality of mirrors forming a ring resonator for the pump laser beam such that a closed propagation path of the pump laser beam, inside the ring resonator, passes through the nonlinear crystal, the plurality of mirrors including:
        an adaptive mirror,
        a curved-mirror pair positioned in a first segment of the propagation path spanning between the adaptive mirror and the nonlinear crystal, the curved-mirror pair forming an imaging system having conjugate planes at the adaptive mirror and the nonlinear crystal, and
        an input coupler for coupling the pump laser beam into the ring resonator, the input coupler being positioned in a second segment of the propagation path that spans between the adaptive mirror and the nonlinear crystal and does not include deflection by the curved-mirror pair; and
    an actuator coupled to one of the plurality of mirrors for keeping the ring resonator resonant with the pump laser beam;
    wherein the adaptive mirror includes an absorber layer for generating heat from absorption of an external laser beam to thermally induce optical power in the adaptive mirror so as to compensate for thermal lensing in the nonlinear crystal.

2. The system of claim 1, further comprising, in the second segment of the propagation path, an output coupler for coupling the output laser beam out of the ring resonator.

3. The system of claim 2, wherein the nonlinear crystal is characterized by the thermal lensing having negative optical power, the system further comprising a negative lens in the first segment of the propagation path between the adaptive mirror and the input coupler.

4. The system of claim 1, further comprising, in the first segment of the propagation path, an output coupler for coupling the output laser beam out of the ring resonator.

5. The system of claim 4, wherein the nonlinear crystal is characterized by the thermal lensing having negative optical power, the system further comprising a positive lens in the second segment of the propagation path between the input coupler and the nonlinear crystal.

6. The system of claim 4, wherein the nonlinear crystal is characterized by the thermal lensing having negative optical power, the system further comprising an adaptive optic having adjustable optical power at least within a range of positive optical powers, the adaptive optic being positioned in the second segment of the propagation path between the input coupler and the nonlinear crystal.

7. The system of claim 6, wherein the adaptive optic includes:
a glass substrate having opposite-facing first and second surfaces, first and second reflective coatings reflective to the pump laser beam and disposed on the first and second surfaces, respectively,
at least one of (a) a first absorber layer disposed on the first reflective coating and configured to induce a first positive lens in the glass substrate when irradiated by a first additional laser beam, and (b) a second absorber layer disposed on the second reflective coating and configured to induce a second positive lens in the glass substrate when irradiated by a second additional laser beam;
wherein the adaptive optic is arranged to receive the pump laser beam via the second surface and direct the pump laser beam from the first surface after reflection at each of the first and second reflective coatings and associated refraction by at least one of the first and second positive lenses.

8. The system of claim 1, further comprising a laser for generating the external laser beam.

9. The system of claim 8, further comprising:
a sensor for measuring a property of either the pump laser beam or the output laser beam; and
a controller for adjusting power of the external laser beam according to the property measured by the sensor.

10. The system of claim 9, wherein the sensor includes a camera arranged to image the pump laser beam or the output laser beam in a far field.

11. The system of claim 10, wherein the output coupler is configured to reflect a portion of the pump laser beam, the system further comprising:
a lens arranged to focus the portion of the pump laser beam on the camera; and
a beamsplitter for separating another portion of the pump laser beam from the output laser beam after reflection from the ring resonator.

12. The system of claim 1, wherein the curved-mirror pair includes:
a first concave mirror having a first focal length and being displaced, along the propagation path, from the nonlinear crystal by the first focal length; and
a second concave mirror having a second focal length and being positioned on a segment of the propagation path that is between the first curved mirror and the adaptive mirror, the second curved mirror being distanced, along the propagation path, from (a) the first curved mirror by a sum of the first and second focal lengths and (b) from the adaptive mirror by the second focal length.

13. The system of claim 1, wherein the curved-mirror pair is configured to magnify the image of the pump laser beam from the nonlinear crystal to the adaptive mirror.

14. The system of claim 1, wherein the ring resonator is a bow-tie resonator.

15. The system of claim 1, wherein the input coupler has a concave reflective surface facing the ring resonator.

16. The system of claim 1, wherein the adaptive mirror further includes:
a substrate characterized by a positive thermo-optic coefficient, and
a reflective coating reflective to the pump laser beam and disposed on a side of the substrate facing away from the ring resonator;
wherein the absorber layer is disposed on a side of the reflective coating facing away from the ring resonator to induce, when heated by the external laser beam, a positive lens for the pump laser beam in the substrate.

17. The system of claim 16, wherein the nonlinear crystal is characterized by the thermal lensing having negative optical power.

18. The system of claim 1, wherein the adaptive mirror is configured to generate a convex mirror when the absorber layer is heated by the external laser.

19. The system of claim 1, wherein the adaptive mirror further includes:
a substrate made of a material having a positive coefficient of thermal expansion, the absorber layer being disposed on a side of the substrate facing the ring resonator such that the absorber layer, when heated by the external laser, causes a local thermal expansion of the substrate, and
a reflective coating reflective to the pump laser beam and disposed on a side of the substrate facing the ring resonator;
wherein the absorber layer is disposed between the substrate and the reflective coating to induce, when heated by the external laser beam, a deformation of the reflective coating that has negative optical power with respect to the pump laser beam.

20. The system of claim 19, wherein the nonlinear crystal is characterized by the thermal lensing having positive optical power.

* * * * *